(12) United States Patent
Fujioka et al.

(10) Patent No.: US 12,198,830 B2
(45) Date of Patent: Jan. 14, 2025

(54) WIRE HARNESS AND METHOD FOR MANUFACTURING WIRE HARNESS

(71) Applicant: SUMITOMO WIRING SYSTEMS, LTD., Yokkaichi (JP)

(72) Inventors: Ryo Fujioka, Yokkaichi (JP); Masashi Hayashi, Yokkaichi (JP)

(73) Assignee: SUMITOMO WIRING SYSTEMS, LTD., Mie (JP)

( * ) Notice: Subject to any disclaimer, the term of this patent is extended or adjusted under 35 U.S.C. 154(b) by 128 days.

(21) Appl. No.: 17/908,641

(22) PCT Filed: Feb. 12, 2021

(86) PCT No.: PCT/JP2021/005140
§ 371 (c)(1),
(2) Date: Sep. 1, 2022

(87) PCT Pub. No.: WO2021/176988
PCT Pub. Date: Sep. 10, 2021

(65) Prior Publication Data
US 2023/0125642 A1  Apr. 27, 2023

(30) Foreign Application Priority Data
Mar. 5, 2020 (JP) ................................. 2020-037376

(51) Int. Cl.
*H01B 13/012* (2006.01)
*H01B 7/18* (2006.01)
*H02G 3/04* (2006.01)

(52) U.S. Cl.
CPC ............. *H01B 13/012* (2013.01); *H01B 7/18* (2013.01); *H02G 3/04* (2013.01)

(58) Field of Classification Search
CPC .... H01B 7/0045; H01B 7/40; B60R 16/0207; B60R 16/0215; H02G 3/04; H02G 3/30; H02G 3/32
See application file for complete search history.

(56) References Cited

U.S. PATENT DOCUMENTS 4,421,945 A * 12/1983 Moisson ................. B29C 61/10
174/DIG. 8
4,874,908 A * 10/1989 Johansson .............. H02B 1/202
439/402

(Continued)

FOREIGN PATENT DOCUMENTS

JP    S58-103816 A    6/1983

OTHER PUBLICATIONS

Mar. 23, 2021 International Search Report issued in International Patent Application No. PCT/JP2021/005140.

*Primary Examiner* — Paresh Paghadal
(74) *Attorney, Agent, or Firm* — Oliff PLC

(57) ABSTRACT

A wire harness including: an electric wire; a shield pipe through which the electric wire extends and at least a portion of which is defined as a bend that is curved; and a plurality of spacers disposed inside the shield pipe, wherein: the plurality of spacers are spaced apart from each other in a lengthwise direction of the shield pipe, and respectively have through holes therein, the electric wire extends through the through holes, and an outer peripheral surface of the electric wire is closely attached to inner periphery surfaces of the through holes.

8 Claims, 8 Drawing Sheets

(56) References Cited

U.S. PATENT DOCUMENTS

| | | | |
|---|---|---|---|
| 6,528,728 B1 * | 3/2003 | Shima | H02G 3/0437 |
| | | | 174/101 |
| 6,710,249 B1 * | 3/2004 | Denton | H02G 3/24 |
| | | | 174/152 G |
| 11,536,397 B2 * | 12/2022 | Belt | F16L 3/1075 |
| 2004/0099427 A1 | 5/2004 | Kihira | |
| 2009/0272576 A1 * | 11/2009 | Medina | B60R 16/0215 |
| | | | 174/72 A |
| 2010/0139948 A1 * | 6/2010 | Smallhorn | H02G 3/32 |
| | | | 174/135 |
| 2014/0061393 A1 * | 3/2014 | Cripps | F16L 3/222 |
| | | | 248/62 |
| 2015/0053455 A1 * | 2/2015 | Hagi | H01B 17/16 |
| | | | 174/113 C |
| 2015/0334882 A1 * | 11/2015 | Sugino | H02G 3/0481 |
| | | | 29/428 |
| 2017/0015258 A1 | 1/2017 | Yanazawa et al. | |
| 2022/0189655 A1 * | 6/2022 | Kitahara | H01B 7/0045 |

* cited by examiner

… (1)

WIRE HARNESS AND METHOD FOR MANUFACTURING WIRE HARNESS

BACKGROUND

The present disclosure relates to a wire harness and a method for manufacturing the wire harness.

When devices such as an inverter apparatus and a motor in a hybrid automobile, an electric automobile, or the like are connected, a wire harness provided with a shield pipe is used in order to achieve an electric wire protection function and an electric shielding function. The wire harness has a structure in which a plurality of electric wires are inserted into an electroconductive shield pipe, for example, as with a shield conductive path disclosed in JP 2004-171952A.

SUMMARY

Incidentally, a wire harness needs to have a shape that reflects a wiring route in a vehicle, but, in a wire harness provided with a shield pipe, the shield pipe needs to undergo a bending process. That is to say, an electric wire is inserted into a straight raw tube of a shield pipe and the raw tube is then bent into a required shape using a pipe bender, whereby the wire harness provided with the shield pipe has a shape that reflects the wiring route in the vehicle.

However, since the electric wire is merely inserted into the shield pipe with a gap therebetween, the electric wire may move in the shield pipe when, for example, the shield pipe is subjected to a bending process. It is conceivable that, when the electric wire moves in the shield pipe, the wiring route of the electric wire in the shield pipe will change as a result of the bending process performed on the shield pipe, for example, and, as a result, the protrusion lengths of the electric wire that protrudes from the two ends of the shield pipe will change.

An exemplary aspect of the disclosure provides a wire harness that has a novel structure, and that can suppress movement of an electric wire in a shield pipe and suppress variation in the protrusion lengths of the electric wire that protrudes from the two ends of the shield pipe, and a method for manufacturing the wire harness.

The wire harness according to the present disclosure includes: an electric wire; a shield pipe through which the electric wire extends and at least a portion of which is defined as a bend that is curved; and a plurality of spacers disposed inside the shield pipe, wherein: the plurality of spacers are spaced apart from each other in a lengthwise direction of the shield pipe, and respectively have through holes therein, the electric wire extends through the through holes, and an outer peripheral surface of the electric wire is closely attached to inner periphery surfaces of the through holes.

A method for manufacturing a wire harness according to the present disclosure includes: preparing a plurality of spacers that are coupled to each other by a coupling, and inserting an electric wire into through holes formed in the respective spacers, thereby attaching the plurality of spacers to the electric wire; inserting the electric wire to which the plurality of spacers is attached, into a raw tube of a shield pipe to be subjected to a bending process; positioning the plurality of spacers in a lengthwise direction of the shield pipe relative to the shield pipe by pulling a first spacer disposed at a position closest to a first end of the shield pipe from among the plurality of spacers, to the first end side, and pulling a second spacer disposed at a position closest to a second end of the shield pipe from among the plurality of spacers, to the second end side; and forming a bend that is curved in the shield pipe in a state where the plurality of spacers is positioned relative to the shield pipe.

According to the present disclosure, it is possible to suppress movement of an electric wire inside a shield pipe in a wire harness, and suppress variation in the protrusion lengths of the electric wire that protrudes from the two ends of the shield pipe.

DETAILED DESCRIPTION OF EMBODIMENTS

Figure 1:
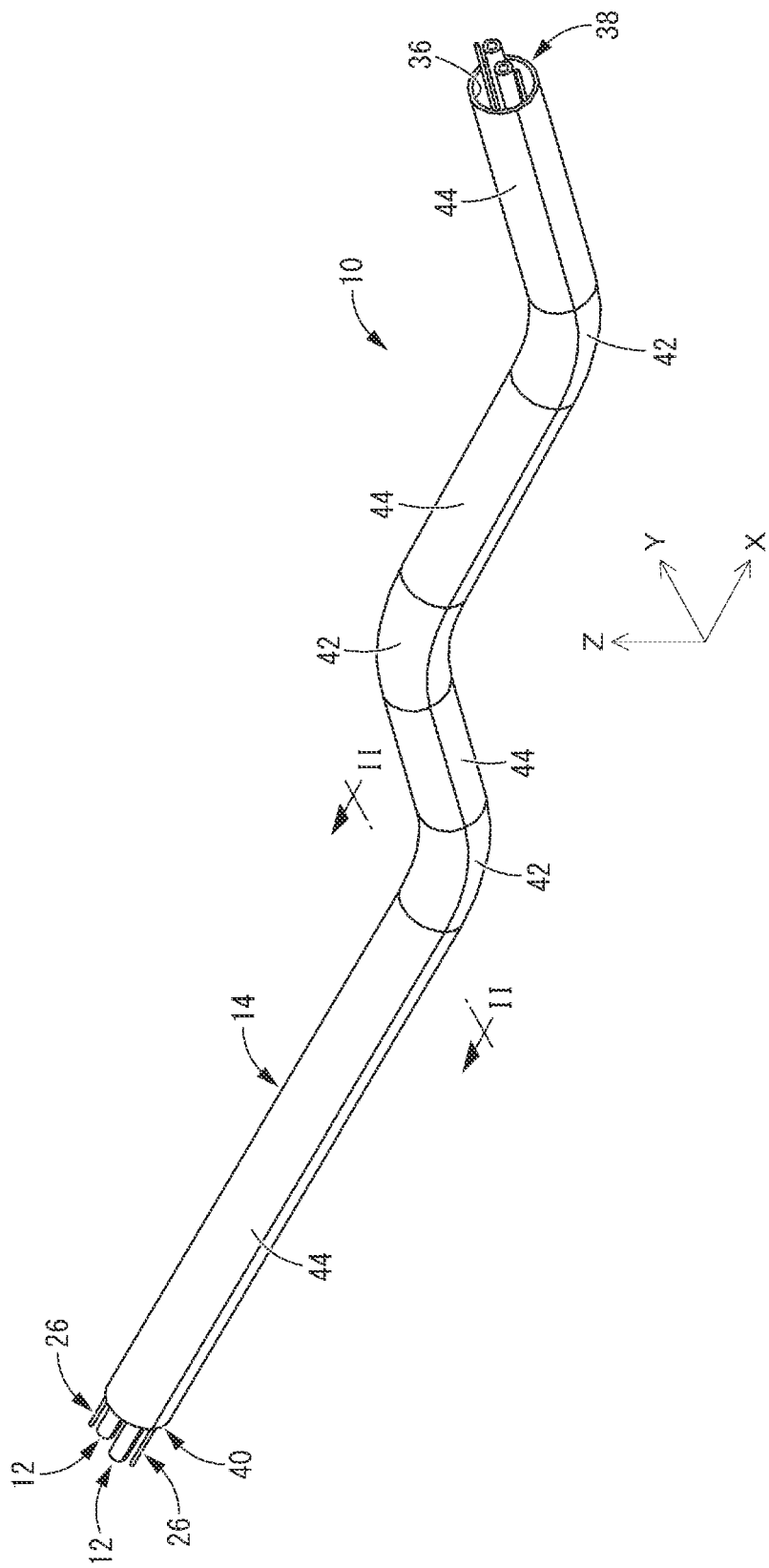
FIG. 1 is a perspective view of a wire harness according to a first embodiment.

Description of Embodiments of the Present Disclosure

First, embodiments of the present disclosure will be listed and described.

A wire harness according to the present disclosure is:

(1) a wire harness that includes: an electric wire, a shield pipe through which the electric wire extends and at least a portion of which is defined as a bent portion that is curved, and a spacer unit that includes a plurality of spacers disposed inside the shield pipe, the plurality of spacers are spaced apart from each other in a lengthwise direction of the shield pipe, and respectively have through holes therein, the electric wire extends through the through holes, and an outer peripheral surface of the electric wire is closely attached to inner periphery surfaces of the through holes.

With the wire harness according to the present disclosure, since the electric wire is positioned inside the shield pipe by the plurality of spacers, the route of the electric wire inside the shield pipe does not change significantly. Therefore, compared with a case where an electric wire is not positioned by spacers, it is possible to decrease the variation range of a length of the electric wire that protrudes from the shield pipe when a bending process of the shield pipe is performed, and to improve the workability of connecting the wire harness to a device, for example.

In addition, since the electric wire is positioned relative to the shield pipe by the spacers, when performing a bending process on the raw tube of the shield pipe that has the electric wire inserted thereinto, and forming a bent portion, it is possible to prevent, in the bent portion, the electric wire from being pressed against the shield pipe. Therefore, for example, it is possible to prevent insulation coating of the electric wire from being pressed hard against and compressed by the shield pipe, and to prevent insulation breakdown of the electric wire. Therefore, it is possible to make the insulation coating of the electric wire thinner while ensuring the electrical insulation obtained by the insulation coating of the electric wire.

Since the outer peripheral surface of the electric wire is closely attached to the spacers on the inner periphery surfaces of the through holes, the spacers are unlikely to move in the lengthwise direction of the electric wire relative to the electric wire, and it is possible to dispose a plurality of spacers relative to the electric wire at appropriate positions in the lengthwise direction.

(2) Preferably, a gap is provided between the shield pipe and the plurality of spacers. When, for example, the spacers are inserted into the shield pipe while being in sliding contact therewith, friction resistance that acts between the shield pipe and the spacers is reduced, inserting work for inserting the spacers into the shield pipe is facilitated, and the spacers are unlikely to he displaced relative to the electric wire. Moreover, when an external force caused by the bending process performed on the shield pipe acts on the spacers, gaps between the shield pipe and the spacers function as buffer regions, and the force acting on the spacers can be reduced. In addition, the inner peripheral spaces of the shield pipe partitioned by the plurality of spacers are in communication with each other through the gaps, whereby it is possible to suppress an increase in the temperature that is caused by local heat retention, and the heat dissipation of the wire harness is improved.

(3) In the above (2), preferably, the shield pipe has a circular inner peripheral shape, and the plurality of spacers have an outer peripheral shape that is different from the inner peripheral shape of the shield pipe. If the outer peripheral shape of the spacers is a shape different from the inner peripheral shape of the shield pipe, namely a circular shape, it is possible to easily provide gaps between the shield pipe and the spacers.

(4) Preferably, at least one of the plurality of spacers is disposed in the bent portion of the shield pipe. The electric wire is positioned in the bent portion of the shield pipe by the spacers, and thus the electric wire can extend along a predetermined route without approaching the inner peripheral side of the curve in the bent portion. Furthermore, it is possible to prevent the electric wire from being pressed against the shield pipe, on the inner peripheral side of the curve of the bent portion, and to prevent insulation breakdown of the electric wire and abrasion of the insulation coating. In addition, for example, if each spacer is made of an elastic body, or a gap is provided between the shield pipe and the spacer, it is possible to reduce a force that acts on the electric wire due to deformation of the shield pipe when forming a bent portion by performing a bending process on the shield pipe.

(5) Preferably, at least one of the plurality of spacers is disposed at a position adjacent to the bent portion of the shield pipe in a lengthwise direction of the shield pipe. At the position adjacent to the bent portion, the electric wire is positioned by the spacer, and thus it is possible to prevent the electric wire from approaching the inner peripheral side of the curve of the bent portion, and to cause an end portion of the electric wire to protrude from the shield pipe by a predetermined length. Furthermore, the electric wire is prevented from being pressed against the shield pipe on the inner peripheral side of the curve of the bent portion, and insulation breakdown of the electric wire, abrasion of the insulation coating, and the like are prevented. In addition, since the spacers are disposed avoiding the bent portion, a force caused by deformation of the shield pipe when the bent portion is formed by performing the bending process on the raw tube of the shield pipe is unlikely to act on the spacers, and damage and the like to the spacers is avoided.

(6) In the above (5), preferably, the plurality of spacers include two spacers disposed adjacent to the bent portion on two sides thereof, respectively, in the lengthwise direction of the shield pipe. The electric wire is positioned on two sides of the bent portion by the spacers, and thus it is possible to more effectively prevent the electric wire from approaching the inner peripheral side of the curve of the bent portion, inside the shield pipe.

(7) Preferably, the spacer unit includes a coupling portion that couples the plurality of spacers to each other. Accordingly, it is possible to easily position all of the spacers coupled by the coupling portion, relative to the shield pipe by positioning at least one spacer at an appropriate position relative to the shield pipe.

(8) In the above (7), preferably, the shield pipe includes a first end portion and a second end portion, the plurality of spacers of the spacer unit include a first spacer that is closest to the first end portion and a second spacer that is closest to the second end portion, and the spacer unit includes a first position correction portion extending from the first spacer toward the first end portion and a second position correction portion extending from the second spacer toward the second end portion.

By pulling the first position correction portion toward the first end portion, and pulling the second position correction portion toward the second end portion, the plurality of spacers coupled to each other by the coupling portion can be moved to appropriate positions in the shield pipe. Note that, when positioning the spacers relative to the shield pipe, both the first position correction portion and the second position correction portion may be pulled, or only one of the first position correction portion and the second position correction portion may be pulled, depending on how the plurality of spacers are displaced relative to the shield pipe.

(9) In the above (8), preferably, the first position correction portion and the second position correction portion are integral with the coupling portion. This is because the number of components is reduced if the first position correction portion and the second position correction portion are integral with the coupling portion.

(10) In the above (8) or (9), preferably, both the first spacer and the second spacer extend in the lengthwise direction of the shield pipe with a quadrangle cross section, and the first position correction portions are respectively fixed to diagonal portions of the first spacer, and the second position correction portions are respectively fixed to diagonal portions of the second spacer.

Even when a spacer inside the shield pipe is inclined, inclination of the spacer can be corrected by pulling the first position correction portions fixed to the diagonal portions of the first spacer as appropriate. Similarly, even if a spacer in the shield pipe is inclined, inclination of the spacer can be corrected by pulling the second position correction portions fixed to the diagonal portions of the second spacer as appropriate.

By pulling the first position correction portions fixed to the diagonal portions of the first spacer at the same time, a moment acting on the first spacer is reduced, and tilting or the like of the first spacer is suppressed. Similarly, by pulling the second position correction portions fixed to the diagonal portions of the second spacer at the same time, a moment acting on the second spacer is reduced, and tilting or the like of the second spacer is suppressed.

A method for manufacturing a wire harness according to the present disclosure is:

(11) a method for manufacturing a wire harness, including: preparing a spacer unit that has a structure in which a plurality of spacers are coupled to each other by a coupling portion, and inserting an electric wire into through holes formed in the respective spacers, thereby attaching the spacer unit to the electric wire, inserting the electric wire to which the spacer unit is attached, into a raw tube of a shield pipe to be subjected to a bending process, positioning the plurality of spacers in a lengthwise direction of the shield pipe relative to the shield pipe by pulling a first spacer disposed at a position closest to a first end portion of the shield pipe from among the plurality of spacers, to the first end portion side, and pulling a second spacer disposed at a position closest to a second end portion of the shield pipe from among the plurality of spacers, to the second end portion side, and forming a bent portion that is curved in the shield pipe in a state where the plurality of spacers are positioned relative to the shield pipe.

A change in the route of the electric wire in the shield pipe is suppressed by the spacers when the bending process for forming a bent portion in the raw tube of the shield pipe is performed, and thus it is possible to secure required amounts of protrusion of the electric wire at the two ends of the shield pipe. In addition, even if the electric wire is inserted into the raw tube of the shield pipe and a bent portion is then formed in the shield pipe, insulation breakdown and the like of the electric wire due to the electric wire being pressed against the shield pipe are prevented, since the electric wire is positioned inside the shield pipe by the spacers. By pulling the first spacer and the second spacer on the two ends as appropriate in a state where the spacer unit is inserted into the raw tube of the shield pipe, it is possible to move the plurality of spacers coupled by the coupling portion in the lengthwise direction of the raw tube, and to position the plurality of spacers relative to the raw tube.

Details of Embodiments of the Present Disclosure

Specific examples of a wire harness and a method for manufacturing the wire harness according to the present disclosure will be described with reference to the attached drawings. It should be noted that the present disclosure is not limited to these examples, but is indicated by the claims, and all changes that come within the meaning and range of equivalency of the claims are intended to be embraced therein.

First Embodiment

Figure 2:
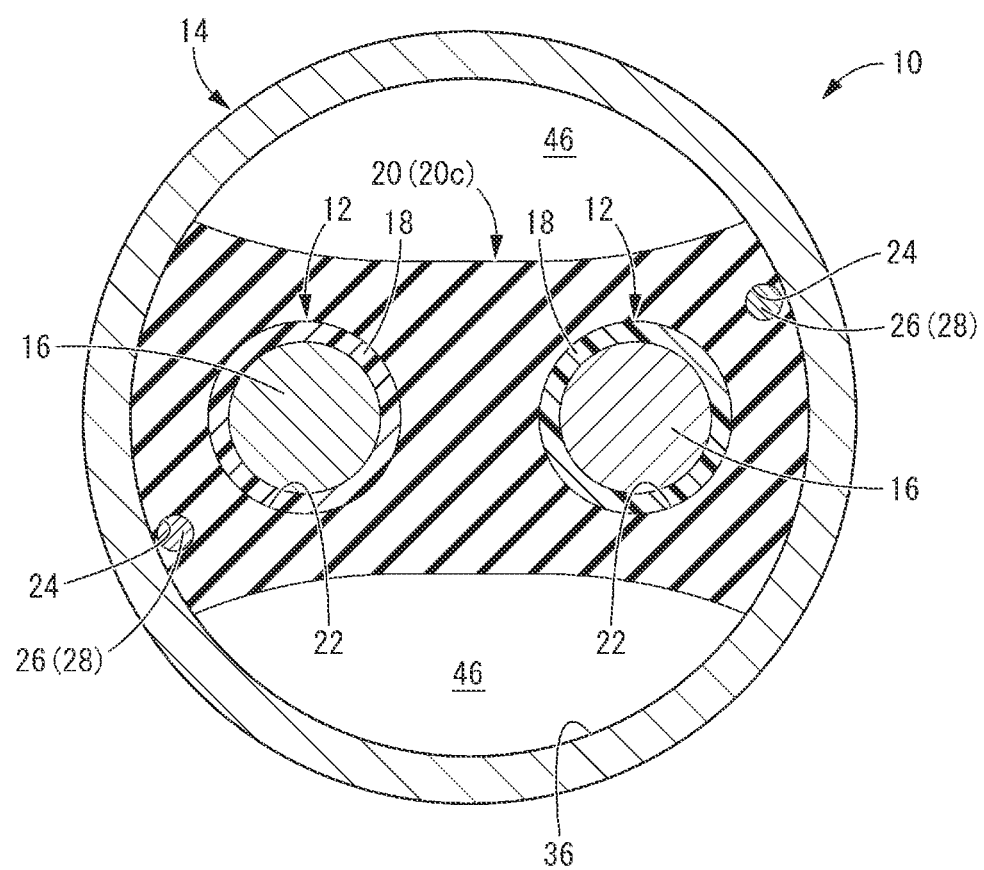
FIG. 2 is a cross-sectional view taken along the line II-II in FIG. 1.
Figure 3:
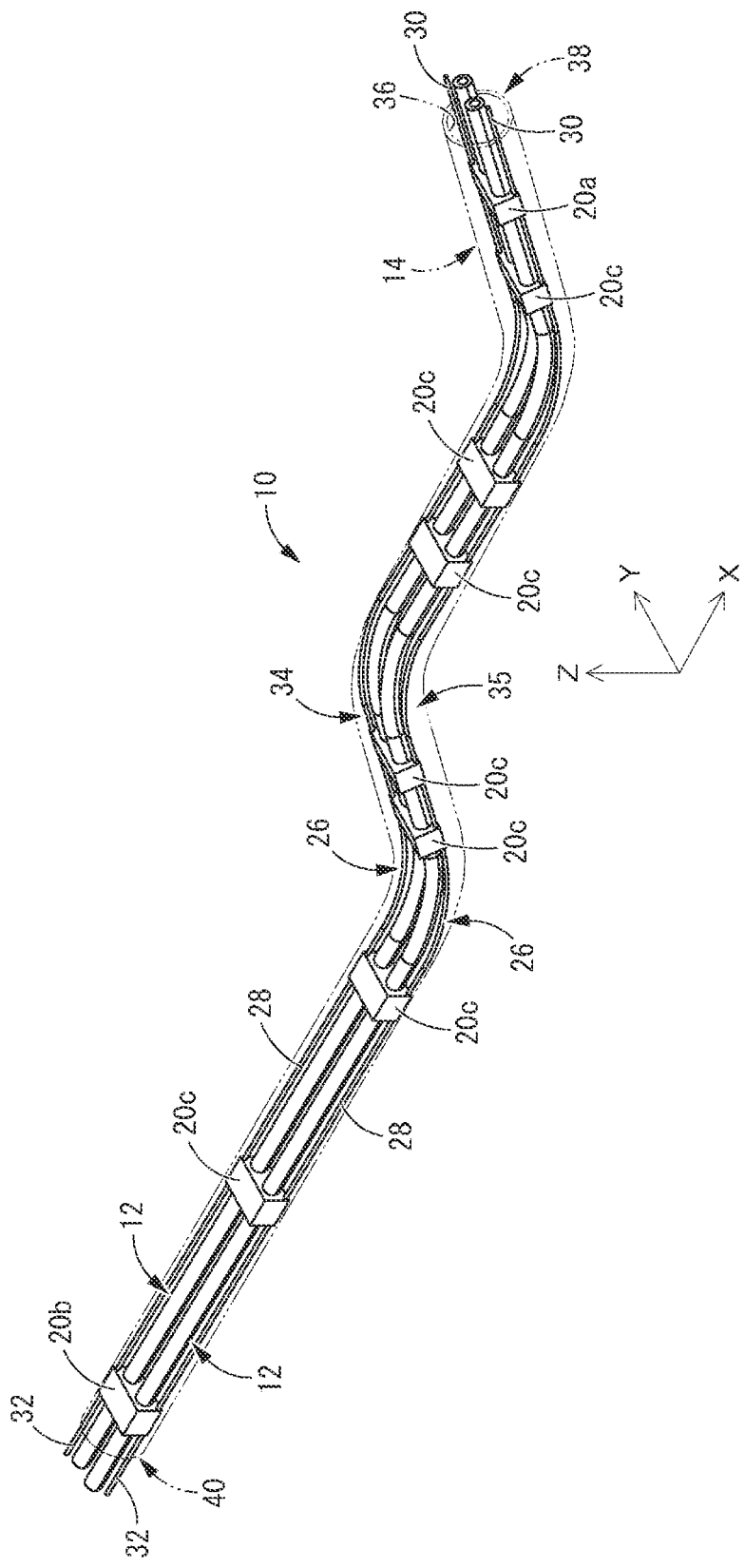
FIG. 3 is a perspective view showing the wire harness in FIG. 1 from which a shield pipe is removed.

Hereinafter, a first embodiment according to the present disclosure will be described with reference to FIGS. 1 to 7. As shown in FIGS. 1 to 3, a wire harness 10 has a structure in which two electric wires 12 are inserted into a shield pipe 14. The following description is given assuming that the upward direction corresponds to a Z direction in FIG. 1, the forward direction corresponds to an X direction in FIG. 1, and the right direction corresponds to a Y direction in FIG. 1. Note that the upward direction, the forward direction, and the right direction mentioned here do not necessarily match the upward direction, the forward direction, and the right direction of a vehicle in which the wire harness 10 is mounted, respectively. In addition, in the following description, a "lengthwise direction" refers to the lengthwise direction of the shield pipe 14, in principle. In addition, reference numerals are given only to some of the same members, and may be omitted for the rest of the members.

Electric Wire 12

As shown in FIG. 2, each electric wire 12 is an insulative electric wire in which an insulation coating 18 formed of a synthetic resin or the like is provided around a core wire 16 constituted by a single wire or a strand wire made of a conductive material. The core wire 16 and the insulation coating 18 of the electric wire 12 are formed of ordinary known materials. The electric wire 12 is set longer than the shield pipe 14, and connectors (not illustrated) are attached to the two end portions of the electric wire 12 in a state of being electrically connected to the core wire 16. The deformation rigidity of the electric wire 12 may be high to a degree where deflection is unlikely to occur during transportation, storage, a manufacturing process, and the like, or may be low to a degree where deflection is relatively likely to occur.

Spacer 20

Figure 4:
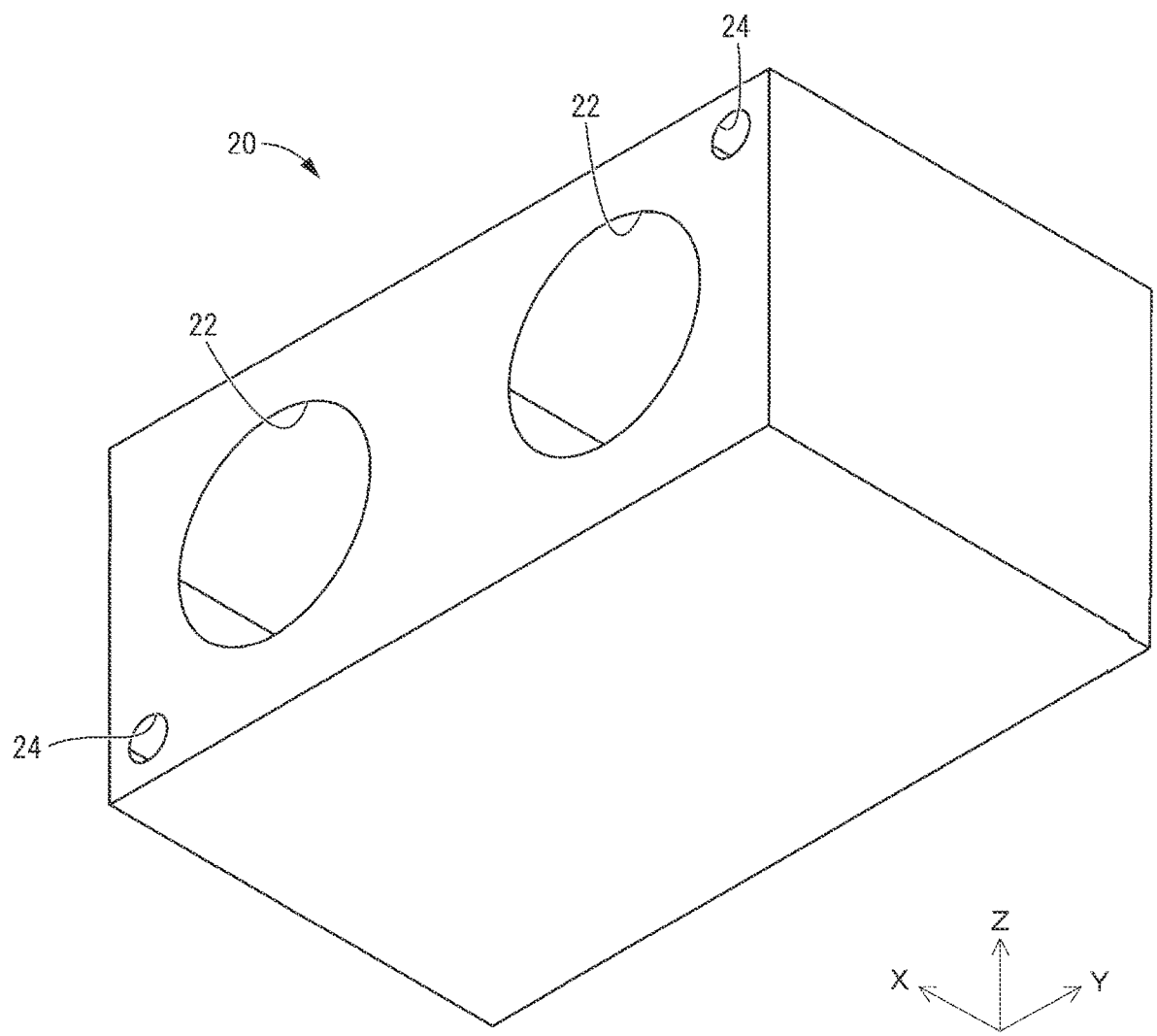
FIG. 4 is a perspective view of a spacer that constitutes the wire harness shown in FIG. 1.

As shown in FIG. 3, a plurality of spacers 20 are attached to the electric wires 12. As shown in FIG. 4, each spacer 20 is substantially a rectangular parallelepiped, and extends in the lengthwise direction with a substantially constant quadrangle cross section. It is desirable that the spacer 20 is formed of rubber, a resin elastomer, or the like, has a rubber-like elasticity, and is elastically deformable. The spacer 20 has two through holes 22 that extend therethrough in the lengthwise direction. Each of the through holes 22 has a hole cross-sectional shape corresponding to the outer circumferential shape of the electric wire 12, and is preferably formed with an internal diameter that is smaller than the external diameter of the electric wire 12. In addition, the spacer 20 has two insertion holes 24 that extend therethrough in the lengthwise direction. The insertion holes 24 are provided outward of the through holes 22 in the spacer 20, and, in this embodiment, are respectively disposed at diagonal portions of the spacer 20.

The plurality of spacers 20 include a first spacer 20a positioned at the end on a first end portion 38 side to be described later, a second spacer 20b positioned at the end on a second end portion 40 side to be described later, and a plurality of third spacers 20c disposed between the first spacer 20a and the second spacer 20b. The plurality of spacers 20 are disposed spaced apart from each other in the lengthwise direction. Note that the first spacer 20a, the second spacer 20b, and the third spacers 20c are the same members in this embodiment, using common components, but may differ in outer shape, size, forming material, and the like.

Spacer Unit 34

The plurality of spacers 20 are coupled to each other by linear bodies 26 inserted into the insertion holes 24 of the spacers 20. Each of the linear bodies 26 is formed of a flexible string, wire, or the like. The linear body 26 includes coupling portions 28 (couplings) that are respectively positioned between adjacent spacers 20 and couples the plurality of spacers 20 to each other. The linear body 26 includes a first position correction portion 30 extending outward in the lengthwise direction from the first spacer 20a past the first end portion 38 to be described later, and a second position correction portion 32 extending outward in the lengthwise direction from the second spacer 20b past the second end portion 40 to be described later. In this embodiment, the coupling portions 28, the first position correction portion 30, and the second position correction portion 32 are formed integrally with each other, as the linear body 26 that is continuous in the lengthwise direction, and thus the number of components is reduced. Understandably, the coupling portions 28, the first position correction portion 30, and the second position correction portion 32 may be provided independently from each other.

Figure 5:
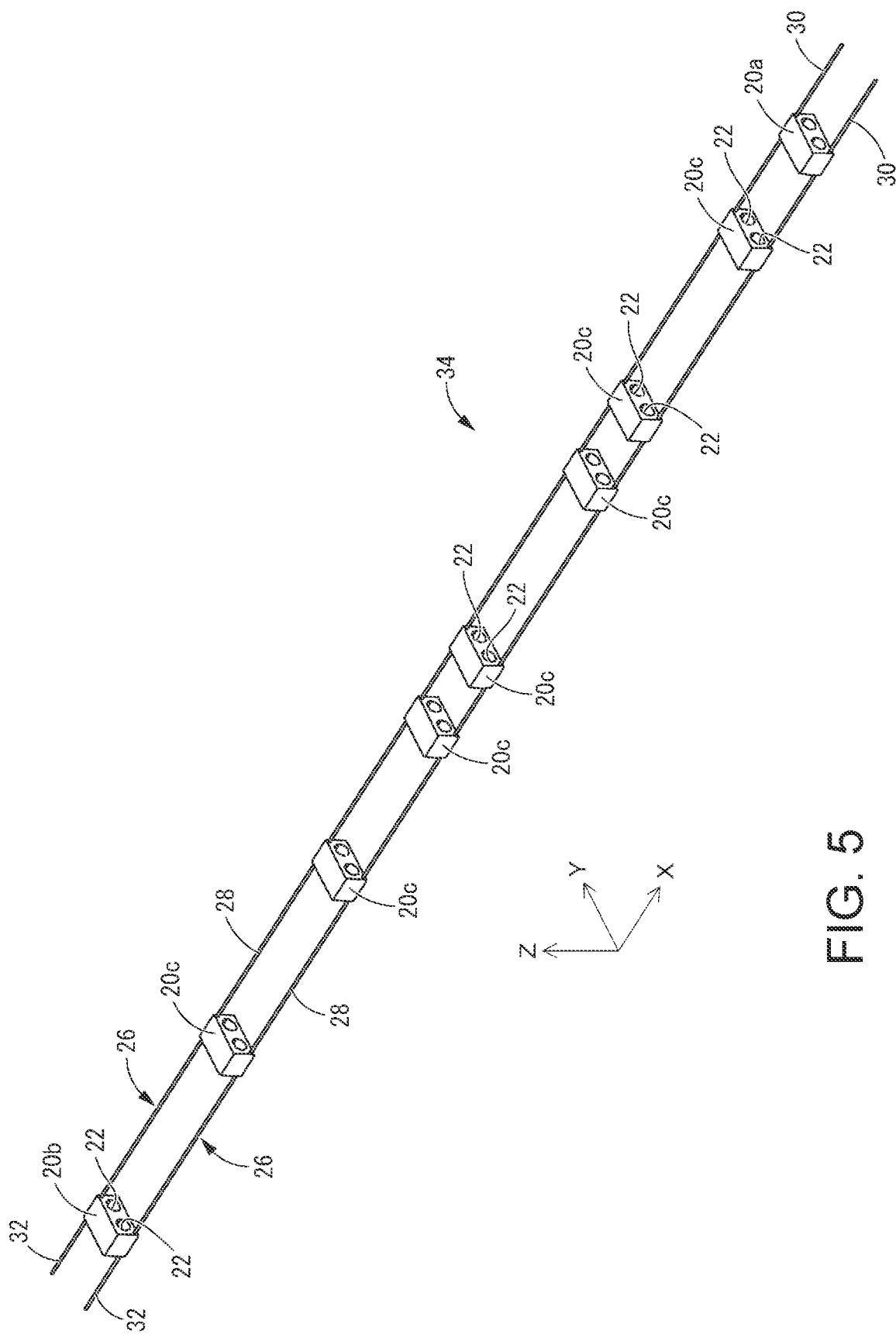
FIG. 5 is a perspective view of a spacer unit that constitutes the wire harness shown in FIG. 1.

The plurality of spacers 20 are coupled to each other while being spaced apart from each other by a predetermined distance, as a result of the linear bodies 26 being inserted into the insertion holes 24, and being fixed to the spacers 20. Moreover, a spacer unit 34 shown in FIG. 5 is constituted by the plurality of spacers 20. The spacer unit 34 includes and is constituted by the plurality of spacers 20, and the linear bodies 26 that include the coupling portions 28, the first position correction portions 30, and the second position correction portions 32. The plurality of spacers 20 are connected by the coupling portions 28, and constitute the spacer unit 34, whereby it is possible to integrally handle the plurality of spacers 20, and transportation, storage, insertion work of the electric wires 12, and the like can be facilitated. Note that an upper limit of the separation distance in the lengthwise direction of the plurality of spacers 20 of the spacer unit 34 is set based on the coupling portions 28 of the linear bodies 26.

In this embodiment, two first position correction portions 30 are provided, and the first position correction portions 30 are respectively fixed to the diagonal portions of the first spacer 20a. Accordingly, when tension of the two first position correction portions 30 acts on the first spacer 20a, moments acting on the first spacer 20a are reduced based on the tension of the first position correction portions 30. In this way, positions at which the plurality of first position correction portions 30 are connected to the first spacer 20a are preferably set such that the moments acting on the first spacer 20a reduce each other based on the tension of the first position correction portions 30. The same applies to two second position correction portions 32 respectively fixed to diagonal portions of the second spacer 20b. That is to say, positions at which the plurality of second position correction portions 32 are connected to the second spacer 20b are preferably set such that moments acting on the second spacer 20b reduce each other based on the tension of the second position correction portions 32.

Electric Wire Unit 35

Figure 6:
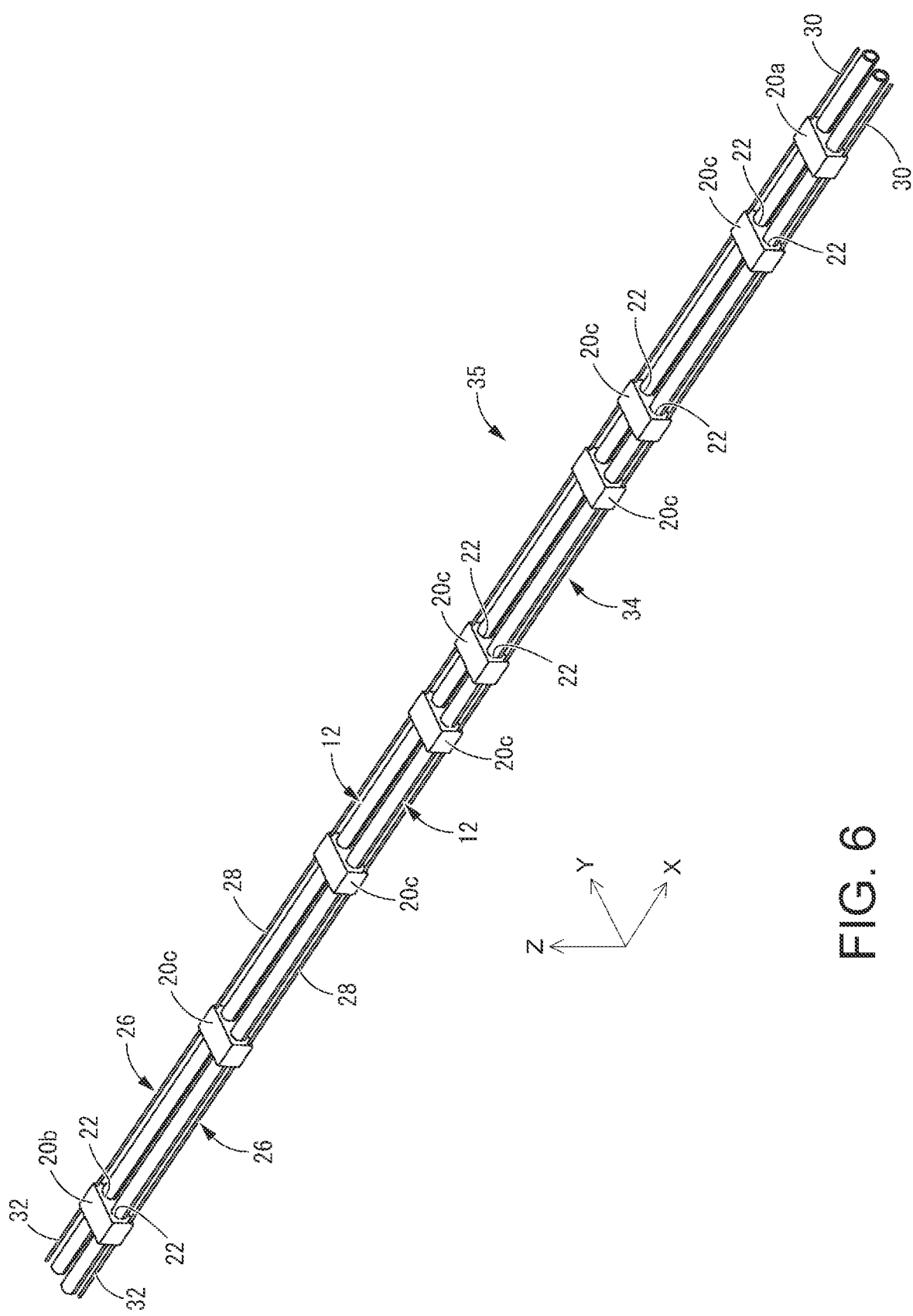
FIG. 6 is a perspective view of an electric wire unit that constitutes the wire harness shown in FIG. 1.

As shown in FIG. 6, the electric wires 12 are inserted into the through holes 22 of the spacers 20 constituting the spacer unit 34, and an electric wire unit 35 is constituted by the electric wires 12 and the spacer unit 34. In the electric wire unit 35, the outer peripheral surfaces of the electric wires 12 are closely attached to the spacers 20, on the inner periphery surfaces of the through holes 22. In this embodiment, the electric wires 12 elastically spread the through holes 22, and the spacers 20 are pressed against the outer peripheral surfaces of the electric wires 12 due to the elasticity of the spacers 20. In this manner, the spacers 20 are mounted onto the electric wires 12 while being closely attached thereto, and thus the spacers 20 are positioned relative to the electric wires 12 in the lengthwise direction. The positions of the electric wires 12 in the lengthwise direction may be fixed relative to the spacers 20, but the electric wires 12 may be positioned in a state of being movable relative to the spacers 20 in the lengthwise direction.

Shield Pipe 14

As shown in FIG. 3, the electric wire unit 35 is inserted into the shield pipe 14. The shield pipe 14 is formed of an electrically conductive material, and, for example, is formed of a metal such as an aluminum alloy. The shield pipe 14 has a tubular shape extending with a substantially circular cross section, and has an internal hole 36 passing therethrough in the lengthwise direction. One end portion of the shield pipe 14 in the lengthwise direction, which is a front end, is defined as the first end portion 38, and the other end portion, which is the rear end, is defined as the second end portion 40. Note that, in FIG. 3, the shield pipe 14 is virtually illustrated using a one dotted chain line, such that the accommodated electric wire unit 35 is easily to recognize.

As shown in FIG. 1, the shield pipe 14 includes bent portions 42 (bends) at a plurality of locations in the lengthwise direction thereof, and straight portions 44 that linearly extend are provided between adjacent bent portions 42. The plurality of bent portions 42 may be curved in the up-down direction or in the direction, or may be curved in different directions. Therefore, the shape of the shield pipe 14 is not limited to a planarly extending shape, and a three-dimensionally extending shape may also be adopted.

The spacers 20 constituting the electric wire unit 35 are disposed inside the shield pipe 14. All of the spacers 20 according to this embodiment are disposed in the straight portions 44 of the shield pipe 14. In addition, at least one spacer 20 is disposed at a position adjacent to each of the plurality of bent portions 42 of the shield pipe 14 in the lengthwise direction. In this embodiment, spacers 20 are respectively disposed on two sides of each bent portion 42 of the shield pipe 14 in the lengthwise direction. Note that a "position adjacent to a bent portion 42 in the lengthwise direction" refers to a portion of a straight portion 44 continuous to a bent portion 42, and is not strictly limited only to a position that is in contact with one of the two ends of the bent portion 42. Therefore, even when a spacer 20 is disposed in a straight portion 44 spaced apart from a bent portion 42 by a slight distance, it can be regarded as being substantially positioned adjacent to the bent portion 42.

Gap 46

As shown in FIG. 2, each of the spacers 20 constituting the electric wire unit 35 is disposed inside the shield pipe 14, and is pressed against the inner periphery surface of the shield pipe 14. Accordingly, each spacer 20 is positioned relative to the shield pipe 14 in the lengthwise direction. A portion of the outer peripheral surface of the spacer 20 is pressed against the inner periphery surface of the shield pipe 14, and another portion of the outer peripheral surface is spaced apart from the inner periphery surface of the shield pipe 14. In this manner, since the cross-sectional shape of the inner periphery surface of the shield pipe 14 is different from the cross-sectional shape of the outer peripheral surface of the spacer 20, gaps 46 extending through the shield pipe 14 in the lengthwise direction are formed between the outer peripheral surface of the spacer 20 and the inner periphery surface of the shield pipe 14. The gaps 46 are formed between surfaces of the spacer 20 and the shield pipe 14 that overlap in a direction that intersects the lengthwise direction. In this embodiment, the inner periphery surface of the shield pipe 14 has a circular cross-sectional shape while the outer peripheral surface of the spacer 20 has a rectangular cross-sectional shape, which is different from the inner periphery surface of the shield pipe 14, and the gaps 46 are respectively provided on two sides of the spacer 20 in the up-down direction. Therefore, in this embodiment, simply by inserting the spacer 20 into the shield pipe 14, the gaps 46 are easily formed due to the difference in cross-sectional shapes.

Method for Manufacturing Wire Harness 10

The wire harness 10 having the above-described configuration is manufactured as follows, for example. First, a plurality of spacers 20 and two linear bodies 26 are prepared, and the linear bodies 26 are inserted into and fixed to the insertion holes 24 of the spacers 20, thereby forming the spacer unit 34 shown in FIG. 5. In this manner, the plurality of spacers 20 are coupled to each other by the linear bodies 26, and constitute the spacer unit 34, and thus the plurality of spacers 20 can be handled as an integral component.

Next, two electric wires 12 are prepared, and are inserted into the through holes 22 of the spacers 20 constituting the spacer unit 34, thereby forming the electric wire unit 35 shown in FIG. 6. In the electric wire unit 35, the spacers 20 of the spacer unit 34 are closely attached to and positioned by the 12?, and thus the electric wires 12 can be handled as a component integral with the spacer unit 34.

Figure 7:
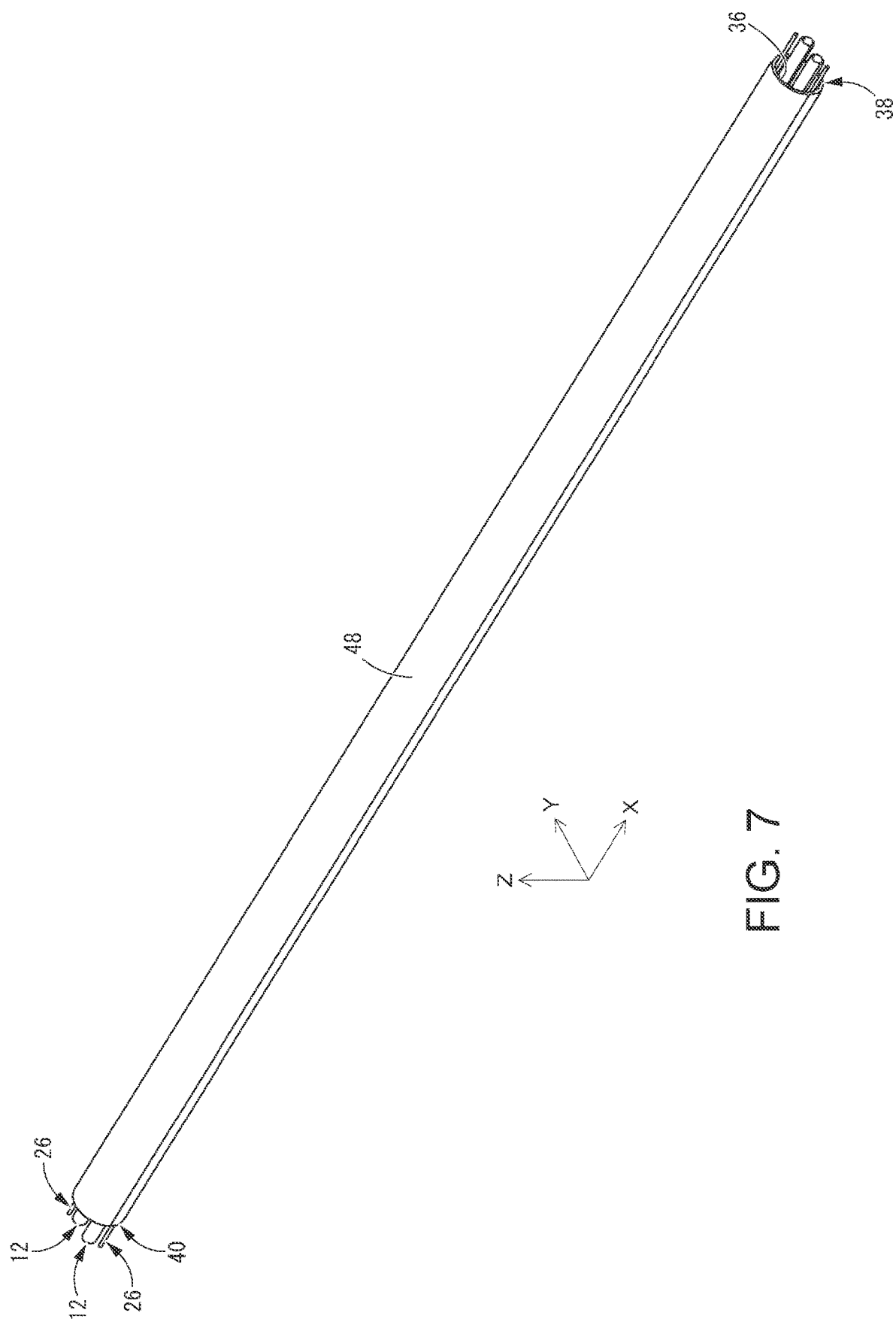
FIG. 7 is a perspective view showing the electric wire unit shown in FIG. 6 when inserted into a raw tube of a shield pipe.

Next, a raw tube 48 of the shield pipe 14 in which no bent portions 42 are formed is prepared, and, as shown in FIG. 7, the electric wire unit 35 is inserted into the raw tube 48. As indicated by the fact that no bent portion 42 is provided, the raw tube 48 is a straight tube that extends linearly over the entire length thereof, and thus the electric wire unit 35 can be easily inserted. The raw tube 48 has a substantially constant circular cross section over the entire length thereof.

Next, in the electric wire unit 35 inserted into the raw tube 48, the first position correction portions 30 of the linear bodies 26 are pulled to the first end portion 38 side of the raw tube 48, and the second position correction portions 32 of the linear bodies 26 are pulled to the second end portion 40 side of the raw tube 48. Accordingly, the first spacer 20a and the second spacer 20b are pulled and moved to predetermined positions in the raw tube 48, and are positioned at appropriate positions in the lengthwise direction relative to the raw tube 48. In addition, the first spacer 20a and the second spacer 20b are coupled to a plurality of third spacers 20c by the coupling portions 28 of the linear bodies 26. Therefore, by pulling the first position correction portions 30 and the second position correction portions 32 of the linear bodies 26 to the two sides, the plurality of spacers 20 can be moved to positions spaced furthest apart from each other and defined based on the lengths of the coupling portions 28. Therefore, displacement of the spacers 20 relative to the electric wires 12, deflection of the electric wires 12 and the linear bodies 26, and the like are resolved by performing a simple operation of pulling the first position correction portions 30 and the second position correction portions 32, and the plurality of spacers 20 can be disposed at appropriate positions in the lengthwise direction of the raw tube 48. The spacers 20 inside the raw tube 48 can be positioned without visually observing them, for example, by providing marks on the first position correction portions 30 and the second position correction portions 32, and pulling the first position correction portions 30 and the second position correction portions 32 such that the marks are located at predetermined positions.

The first position correction portions 30 are respectively provided on two sides in a diagonal direction of the first spacer 20a, and moments oriented to reduce each other act on the first spacer 20a based on a tensile force acting on the two first position correction portions 30 toward the first end portion 38 side. Therefore, tilting of the first spacer 20a resulting from the first position correction portions 30 being pulled is suppressed, and the first spacer 20a is likely to maintain an appropriate orientation. Similarly, the second position correction portions 32 are respectively provided on two sides in a diagonal direction of the second spacer 20b, and moments oriented to reduce each other act on the second spacer 20b based on a tensile force acting on the two second position correction portions 32 toward the second end portion 40 side. Therefore, tilting of the second spacer 20b resulting from the second position correction portions 32 being pulled is suppressed, and the second spacer 20b is likely to maintain an appropriate orientation.

Moreover, when the first spacer 20a is inclined, inclination of the first spacer 20a can be corrected, for example, by pulling only one of the first position correction portions 30. Similarly, also when the second spacer 20b is inclined, inclination of the second spacer 20b can be corrected, for example, by pulling only one of the second position correction portions 32.

The linear bodies 26 position the plurality of spacers 20 relative to the raw tube 48 before the later-described bending process is performed on the raw tube 48, and no problem occurs even if the linear bodies 26 break during or after the bending process performed on the raw tube 48. In addition, the linear bodies 26 may undergo elastic deformation or plastic deformation so as to extend when subjected to a large force during the bending process performed on the raw tube 48, or the like.

In this embodiment, the internal diameter of the raw tube 48 is set smaller than the outer size in a diagonal direction of the spacers 20, and the spacers 20 are inserted into the raw tube 48 with at least corner portions thereof being in contact with the inner periphery surface of the raw tube 48. Therefore, there are cases where a frictional force acts between the raw tube 48 and the spacers 20, the spacers 20 move in the lengthwise direction relative to the electric wires 12, and the electric wires 12 and the coupling portions 28 deflect. However, the electric wires 12 are inserted into the through holes 22 of the spacers 20 while expanding the through holes 22, and the outer peripheral surfaces of the electric wires 12 are closely attached to the inner periphery surfaces of the through holes 22 of the spacers 20. Accordingly, even if a friction force acts between the raw tube 48 and the spacers 20, the spacers 20 are unlikely to move relative to the electric wires 12 in the lengthwise direction. In addition, since the gaps 46 are provided on two sides in the up-down direction between the raw tube 48 and the spacers 20, a friction force acting between the raw tube 48 and the spacers 20 when the spacers 20 are inserted into the raw tube 48 is small compared with a case where no gap 46 is provided. Therefore, the spacers 20 can be easily inserted into the raw tube 48, and displacement of the spacers 20 relative to the electric wires 12 and the raw tube 48 is suppressed. Understandably, the internal diameter of the raw tube 48 may be larger than the outer size in the diagonal direction of the spacers 20, and, for example, a configuration may also be adopted in which processing for reducing the diameter of the raw tube 48 is performed at portions thereof where each spacer 20 is to be displaced, and thus the outer peripheral surface of the spacer 20 is pressed against the inner periphery surface of the raw tube 48.

Next, the raw tube 48 that has the electric wire unit 35 inserted thereinto is subjected to a bending process using a pipe bender (not illustrated), and a plurality of bent portions 42 that reflect the wiring route of the wire harness 10 in the vehicle are formed. Input of a tensile force to the first position correction portions 30 and the second position correction portions 32 is preferably canceled before the bending process is performed on the raw tube 48. As a result of processing the raw tube 48 and forming predetermined bent portions 42, the shield pipe 14 is configured, and it is possible to achieve the wire harness 10 provided with the shield pipe 14 such as that shown in FIG. 1. The spacers 20 are positioned relative to the raw tube 48 before the bent portions 42 are formed, and thus, in the shield pipe 14 in which the bent portions 42 are formed, the spacers 20 are disposed at predetermined positions such as positions on two sides of each of the bent portions 42. In the shield pipe 14, the number of bent portions 42 that are formed, positions, curvature, curve direction, and the like are set as appropriate in accordance with the wiring route of the wire harness 10 in the vehicle (not illustrated).

With the wire harness 10 configured as described above, since changes to the wiring route of the electric wires 12 are limited in the shield pipe 14, variation in the lengths of protrusion of the electric wires 12 from the two ends of the shield pipe 14 is suppressed and stabilized. Therefore, for example, end portions of the electric wires 12 can reliably reach a device of the vehicle (not illustrated), and the workability of connection between the electric wires 12 and a device is improved.

Since the electric wires 12 are positioned relative to the shield pipe 14 by the plurality of spacers 20, movement of the electric wires 12 inside the shield pipe 14 is regulated. Therefore, the wiring route of the electric wires 12 inside the shield pipe 14 is held without any significant change, and the electric wires 12 are not pressed against the shield pipe 14, in the bent portions 42. As a result, short-circuiting between the shield pipe 14 and the electric wires 12 caused by the insulation coating 18 of the electric wires 12 being compressed is prevented, and the durability of the insulation coating 18 is improved. In addition, there is no need to envision that the thickness of the insulation coating 18 will be reduced due to being pressed against the shield pipe 14, and thus a thinner insulation coating 18 can also be adopted.

If, for example, the shield pipe 14 has a three-dimensionally extending shape having both a portion extending in the up-down direction and a portion extending in the left-right direction due to the plurality of bent portions 42, the orientation of the raw tube 48 in the vertical direction is changed in accordance with the curve directions of a plurality of bent portions 42 in the raw tube 48, in a process of forming the bent portions 42. As a result, the electric wires 12 inserted into the raw tube 48 will move inside the raw tube 48 under the action of gravity, a centrifugal force, and the like. Even in such a case, the wiring route of the electric wires 12 is maintained inside the shield pipe 14 without a significant change since the electric wires 12 are positioned relative to the shield pipe 14 by the plurality of spacers 20.

In the wire harness 10, the spacers 20 are disposed at positions avoiding the bent portions 42 of the shield pipe 14, and are disposed particularly at positions adjacent to the bent portions 42 in the lengthwise direction.

Accordingly, it is possible to prevent an external force that is generated when forming the bent portions 42 from directly acting on the spacers 20, prevent the electric wires 12 from extending and approaching the inner side of the curve of the bent portions 42 while securing the durability of the spacers 20, and prevent the electric wires 12 from being pressed against the bent portions 42. Since spacers 20 are respectively disposed adjacent to each of the bent portions 42 on two sides thereof, the electric wires 12 can be more effectively positioned in the bent portions 42, and the electric wires 12 can be prevented from being pressed against the shield pipe 14, on the inner side of the curve of the bent portions 42.

In this embodiment, since the spacers 20 are disposed at positions adjacent to the bent portions 42, it is conceivable that, when the cross-sectional shape of the raw tube 48 deforms at a bent portion 42, an external force will act on the spacers 20 from the raw tube 48. In that case, since the gaps 46 are provided between the raw tube 48 and the spacers 20, stress acting on the spacers 20 is reduced compared with a case where the entire outer peripheral surfaces of the spacers 20 are restrained by the raw tube 48, and the durability of the spacers 20 is improved.

In the internal hole 36 of the shield pipe 14, spaces on two sides of each spacer 20 in the lengthwise direction are in communication with each other through the gaps 46, and the internal hole 36 is open to an outside space without any sealed region partitioned by the spacers 20. Therefore, in the internal hole 36, a local increase in the temperature is prevented, and the heat dissipation of the wire harness 10 is improved.

Other Embodiments

The technique described in the present specification is not limited to the embodiments described above with reference to the drawings, and, for example, embodiments to be described below are encompassed in the technical scope of the technique described in the present specification.

Figure 8:
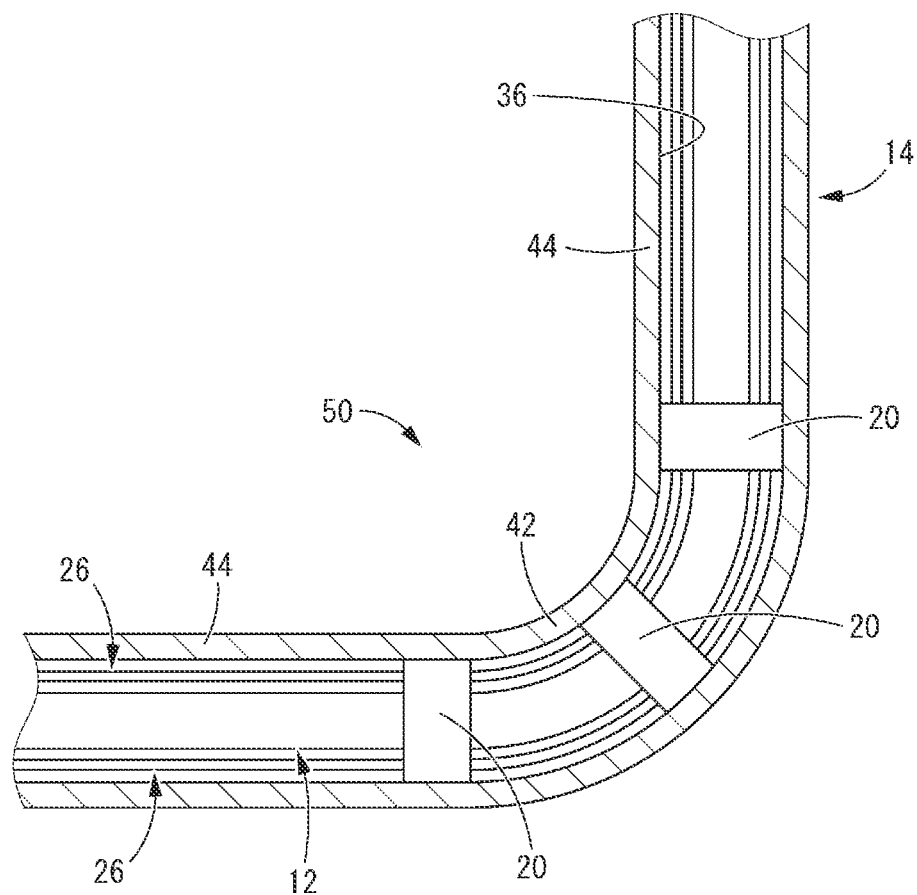
FIG. 8 is a plan view showing a portion of a wire harness according to a second embodiment from which a shield pipe is cut away.

(1) In the first embodiment above, the spacers 20 are disposed in the straight portions 44 of the shield pipe 14, adjacent to the bent portions 42 on two sides thereof in the shield pipe 14, but at least one of the spacers 20 may be disposed in a bent portion 42 as with a wire harness 50 according to the second embodiment shown in FIG. 8. If the spacer 20 is disposed in the bent portion 42 of the shield pipe 14 in this manner, the electric wires 12 can be firmly positioned at a predetermined position in the shield pipe 14, in the bent portion 42 in which the electric wires 12 and the shield pipe 14 are likely to come into contact with each other. As a result, it is possible to more effectively prevent insulation breakdown of the electric wires 12, abrasion of the insulation coating 18, or the like caused by the electric wires 12 being pressed against the shield pipe 14.

If a spacer 20 is disposed in a bent portion 42, an external force accompanying deformation of the raw tube 48 when the bent portion 42 is formed in the raw tube 48 of the shield pipe 14 is likely to be input to the spacer 20. In view of this, gaps 46 are provided between each spacer 20 and the shield pipe 14 as in the above first embodiment, the gaps 46 functioning as buffer regions, and a force acting on the spacer 20 may be reduced. In addition, a free surface is provided on the outer peripheral surface of the spacer 20, and thus stress acting on the spacer 20 is reduced, and a force that is transmitted from the spacer 20 to the electric wires 12 can be reduced.

(2) Even if the outer peripheral shape (the cross-sectional shape of the outer peripheral surface) of the spacers 20 is a shape other than a rectangle such as that in the above first embodiment, the gaps 46 can be easily formed as long as the outer peripheral shape of the spacers 20 is different from the inner peripheral shape (the cross-sectional shape of the inner periphery surface) of the shield pipe 14, namely a circular shape. Specifically, the outer peripheral shape of the spacers 20 may be a polygon other than a rectangle, an oval, an odd-shape, or the like.

(3) The orientations of all of the plurality of spacers 20 may be the same in the circumferential direction of the shield pipe 14 as in the first embodiment above, or at least one of the spacers 20 may be disposed in a different orientation.

(4) The number of electric wires 12 that are inserted into the shield pipe 14 may be three or more, and, in that case, it suffices for at least two electric wires 12 to be inserted into the through holes 22 of the spacers 20. Note that the number of electric wires 12 that are inserted into the shield pipe 14 may be one.

(5) In consideration of the number of components, inclination of the spacers 20, and the like, the number of first position correction portions 30 and the number of second position correction portions 32 are desirably two as in the first embodiment, but may be one, or three or more. The number of coupling portions 28 may also be one or three or more. Note that the first position correction portions 30, the second position correction portions 32, and the coupling portions 28 may differ in the number thereof, arrangement, length, cross-sectional shape, and the like.

The invention claimed is:

1. A wire harness comprising:
an electric wire;
a shield pipe through which the electric wire extends and at least a portion of which is a bend that is curved; and
a plurality of spacers inside the shield pipe, wherein:
the plurality of spacers have respective through holes and are spaced apart from each other in a lengthwise direction of the shield pipe;
the electric wire extends through the through holes;
an outer peripheral surface of the electric wire is closely attached to inner periphery surfaces of the through holes, and the inner periphery surfaces are continuous all around the outer peripheral surface of the electric wire;
a coupling couples the plurality of spacers to each other;
the shield pipe includes a first end and a second end;
the plurality of spacers includes a first spacer that is closest to the first end and a second spacer that is closest to the second end;
a first position correction portion extends from the first spacer toward the first end and a second position correction portion extends from the second spacer toward the second end;
both the first spacer and the second spacer have a quadrangle cross section that extends in the lengthwise direction of the shield pipe; and
the first position correction portion is fixed to diagonal portions of the first spacer, and the second position correction portion is fixed to diagonal portions of the second spacer.

2. The wire harness according to claim 1,
wherein a respective gap is between the shield pipe and each of the plurality of spacers.

3. The wire harness according to claim 2, wherein:
an inner periphery of the shield pipe is circular, and
the plurality of spacers have an outer peripheral shape that is different from the inner periphery of the shield pipe.

4. The wire harness according to claim 1, wherein at least one spacer of the plurality of spacers is in the bend of the shield pipe.

5. The wire harness according to claim 1, wherein at least one spacer of the plurality of spacers is adjacent to the bend of the shield pipe in a lengthwise direction of the shield pipe.

6. The wire harness according to claim 5, wherein the plurality of spacers include two spacers adjacent to the bend on two sides thereof, respectively, in the lengthwise direction of the shield pipe.

7. The wire harness according to claim 1,
wherein the first position correction portion and the second position correction portion are integral with the coupling.

8. A method for manufacturing a wire harness, comprising:
preparing a plurality of spacers that are coupled to each other by a coupling, and inserting an electric wire into through holes formed in the respective spacers, wherein inner periphery surfaces of the through holes are continuous all around an outer peripheral surface of the electric wire, thereby attaching the plurality of spacers to the electric wire;
inserting the electric wire to which the plurality of spacers is attached, into a raw tube of a shield pipe to be subjected to a bending process;
positioning the plurality of spacers in a lengthwise direction of the shield pipe relative to the shield pipe by pulling a first spacer at a position closest to a first end of the shield pipe from among the plurality of spacers, to the first end side, and pulling a second spacer at a position closest to a second end of the shield pipe from among the plurality of spacers, to the second end side; and
forming a bend that is curved in the shield pipe in a state where the plurality of spacers is positioned relative to the shield pipe, wherein:
a coupling couples the plurality of spacers to each other;
the shield pipe includes a first end and a second end;
the plurality of spacers includes a first spacer that is closest to the first end and a second spacer that is closest to the second end;
a first position correction portion extends from the first spacer toward the first end and a second position correction portion extends from the second spacer toward the second end;
both the first spacer and the second spacer have a quadrangle cross section that extends in the lengthwise direction of the shield pipe; and
the first position correction portion is fixed to diagonal portions of the first spacer, and the second position correction portion is fixed to diagonal portions of the second spacer.

* * * * *